United States Patent [19]

Kwon

[11] Patent Number: 5,510,290
[45] Date of Patent: Apr. 23, 1996

[54] METHOD FOR FORMING A FIELD OXIDE LAYER IN A SEMICONDUCTOR DEVICE WHICH PREVENTS BIRD BEAK BY NITRADATION OF PAD OXIDE

[75] Inventor: Sung K. Kwon, Ichonkun, Rep. of Korea

[73] Assignee: Hyundai Electronics Industries Co., Ltd., Rep. of Korea

[21] Appl. No.: 414,109

[22] Filed: Mar. 31, 1995

[30] Foreign Application Priority Data

Apr. 1, 1994 [KR] Rep. of Korea .................. 1994-6951

[51] Int. Cl.$^6$ ........................ H01L 21/76; H01L 21/762
[52] U.S. Cl. ................................ 437/69; 437/72
[58] Field of Search .................. 437/239, 69, 242, 437/70, 72, 73

[56] References Cited

U.S. PATENT DOCUMENTS

| | | | |
|---|---|---|---|
| 5,173,444 | 12/1992 | Kawamura | 437/69 |
| 5,229,318 | 7/1993 | Straboni et al. | 437/69 |
| 5,252,511 | 10/1993 | Bhan et al. | 437/70 |
| 5,260,229 | 11/1993 | Hodges et al. | 437/69 |
| 5,369,051 | 11/1994 | Rao et al. | 437/69 |
| 5,374,584 | 12/1994 | Lee et al. | 437/69 |
| 5,397,733 | 3/1995 | Jang | 437/69 |
| 5,399,520 | 3/1995 | Jang | 437/67 |
| 5,447,885 | 9/1995 | Cho et al. | 437/70 |

FOREIGN PATENT DOCUMENTS

| | | | |
|---|---|---|---|
| 61-071646 | 4/1986 | Japan | H01L 21/76 |
| 61-174737 | 8/1986 | Japan | H01L 21/76 |
| 1-274457 | 11/1989 | Japan | H01L 21/94 |

*Primary Examiner*—R. Bruce Breneman
*Assistant Examiner*—Matthew L. Whipple
*Attorney, Agent, or Firm*—Merchant, Gould, Smith, Edell, Welter & Schmidt

[57] ABSTRACT

A method for forming a field oxide layer in a semiconductor device comprising the steps of: forming a pad oxide layer and a first resistant layer of oxidation, in turn, on a substrate; opening a field region by etching a portion of the said resistant layer of oxidation, whereby a part of the said pad oxide layer remains; forming the pad oxide layer into a nitric oxide layer; forming a second and a third resistant layer of oxidation, in turn, on a resultant structure; forming a spacer layer by applying anisotropic etching to the third resistant layer of oxidation; exposing a portion of the substrate by etching the second resistant layer of oxidation and the pad layer which is formed into the nitride layer; and forming the field oxide layer by oxidizing the substrate.

8 Claims, 2 Drawing Sheets

METHOD FOR FORMING A FIELD OXIDE LAYER IN A SEMICONDUCTOR DEVICE WHICH PREVENTS BIRD BEAK BY NITRADATION OF PAD OXIDE

BACKGROUND OF THE INVENTION

1. Field of the Invention

The present invention relates to a method for forming a field oxide layer in a high integrated semiconductor device, and more particularly to a method capable of minimizing a bird's beak.

2. Description of the Prior Art

A number of isolation techniques of a semiconductor device have been developed in order to improve the characteristics of a device corresponding to integration degree.

In general, a diversity of field oxide layers are made by using a LOGOS (Local Oxidation of Silicon) and PBL(Polysilicon Buffered LOGOS) process, which is a modification of the LOGOS process.

Namely, a pad oxide layer and a resistant layer of oxidation, such as nitride, layer, are in order deposited on a semiconductor substrate, and a predetermined portion of the resistant layer of oxidation is removed, what we call isolation etching. Finally, an exposed substrate is oxidized in a portion which is the nitride removal region.

In another conventional method for making a field oxide layer, a polysilicon layer, additionally, is used on the above oxide layer in order for a bird's beak not to increase.

Furthermore, for solving the problem of decreasing an active region, which is generated by the bird's beak formed in an edge of the field oxide layer, a spacer layer is formed at the side wall of etched materials after the isolation etching. Also, in order that the field oxide layer has not high topology, the substrate is etched at the time of isolation etching and the oxidation processing can be additionally executed after a trench processing.

However, the conventional methods for forming the field oxide layers form a poor profile of itself and cause a complexity in that a planarization process, such as dry planarization etching or CMP(Chemical mechanical polishing), which deposits a thick oxide layer on the resulting structure, is needed to overcome the topology, which results from the combination of narrow trench and wide trench, which leaves a problem in that it is very difficult to smoothly planarize the thick oxide layer.

SUMMARY OF THE INVENTION

Therefore, an object of the present invention is to solve the aforementioned problems encountered in the prior art and to provide a method for forming a field oxide layer capable of decreasing the stress on the wall of the isolation etching portion by forming a nitride layer and improving a profile of the field oxide layer.

In accordance with the present invention, this object can be accomplished by the method for forming a field oxide layer, which comprise the steps of: forming a pad oxide layer and a first resistant layer of oxidation, in turn, on a substrate; opening a field region by etching a portion of said resistant layer of oxidation whereby a part of said pad oxide layer remains; forming said pad oxide layer into a oxynitride layer; forming a second and a third resistant layer of oxidation, in turn, on a resultant structure; forming a spacer layer by applying anisotropic etching to said third resistant layer of oxidation; exposing a portion of said substrate by etching said second resistant layer of oxidation and said pad layer which is formed into said oxynitride layer; and forming said field oxide layer by oxidizing said substrate.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE INVENTION

Hereinafter, the preferred embodiment of the present invention will be described in detail with reference to the drawings.

Figure 1A:
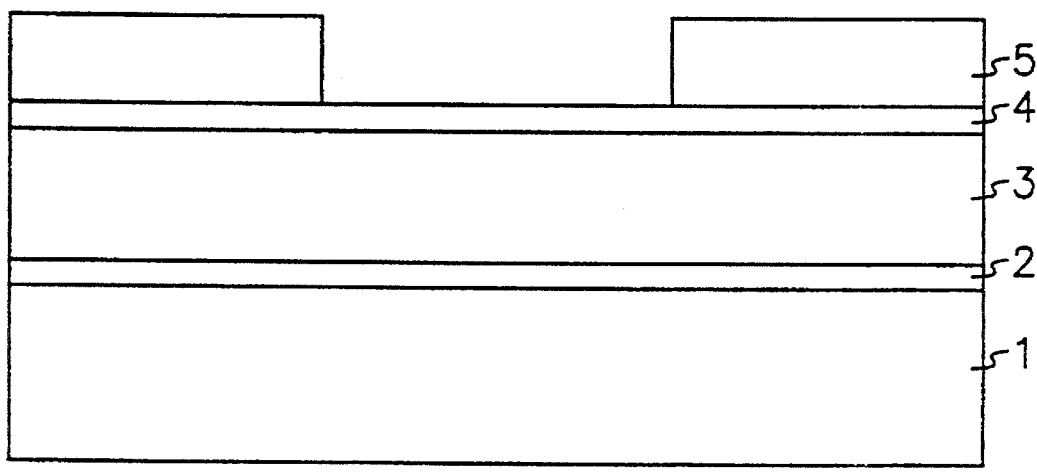
FIGS. 1A to 1E are processing flows illustrating a method for forming a field oxide layer according to the preferred embodiment of the present invention.

Referring; to FIG. 1A, on a substrate 1 is formed a pad oxide layer 2 to a thickness of about 50 to 200 Å and a resistant nitride layer 3 of oxidation is deposited on pad oxide layer 2 to a thickness about 1000 to 3000 Å. Subsequently, an oxide layer 4 to a thickness of about 100 to 1000 Å is deposited on the resistant nitride layer 3 of oxidation in a method of chemical vapor deposition (hereinafter referred as CVD), and a photoresist pattern 5 is formed on the oxide layer 4 in order to execute isolation etching.

Figure 1B:
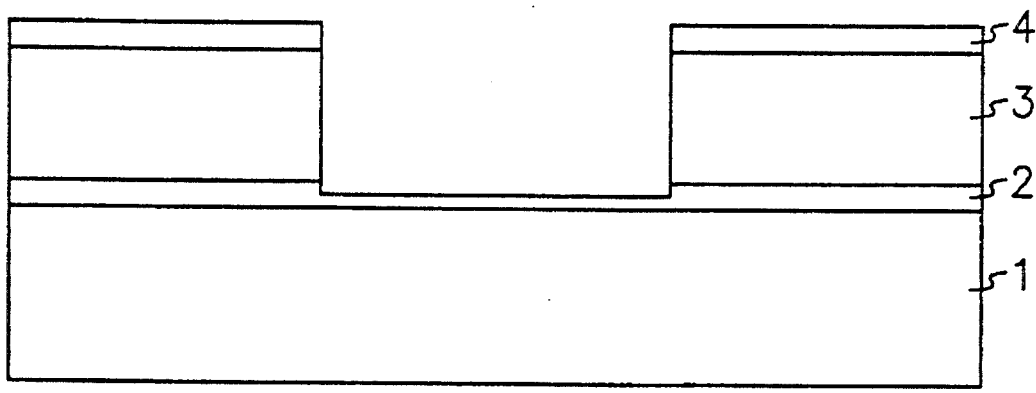

As shown in FIG. 1B, the oxide layer 4 and the nitride layer 3 are, in order, etched by using the photoresist pattern 5 as on etching barrier so that the remnant of the pad oxide layer 2 is approximately 30 to 50 percent of total thickness of itself. In the subsequent process, the photoresist pattern 5 is removed.

Figure 1C:
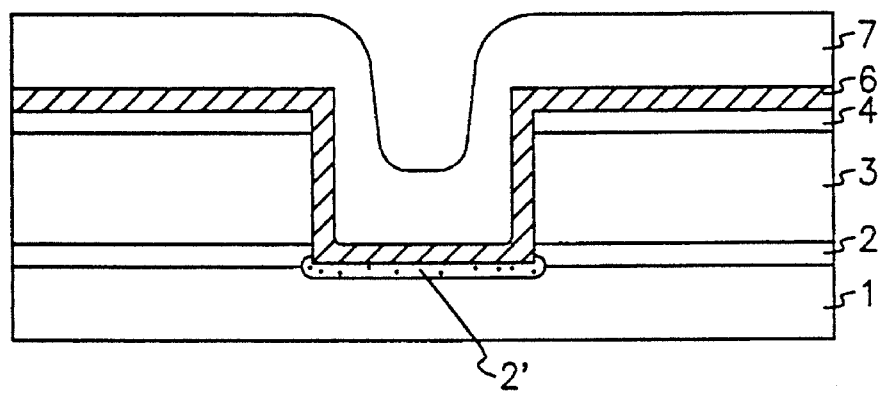

FIG. 1C shows that the remaining pad oxide layer 2 is turned into a oxynitride layer 2', at 1200° C., in the presence of $N_2O$, $NH_3$ gas, and that a nitride layer 6 is deposited entirely on the resulting structure to a thickness of about 30 to 300 Å, and that an oxide layer 7 is deposited on the nitride layer 6 to a thickness of about 300–2000 Å.

Figure 1D:
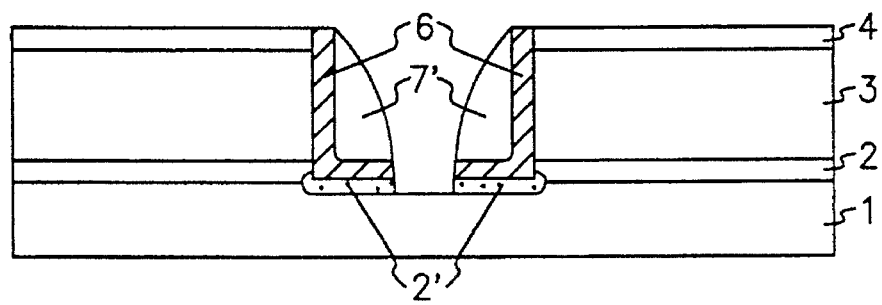

Then, after forming an oxide spacer 7', the exposed nitride layer 6 and oxynitride layer 2' are etched, respectively as shown in FIG. 1D.

At this time, the oxynitride layer 2' and nitride layer 6 which are formed in isolation etching portion function as a barrier to decrease stress generated during the oxidation process.

Also, the CVD oxide layer 4 or the oxide spacer 7' can be removed or not be removed. This can be selected according to the pattern of a gate polysilicon layer since the topology of the field oxide layer is alleviated at the subsequent step of removing the resistant layer of oxidation.

Figure 1E:
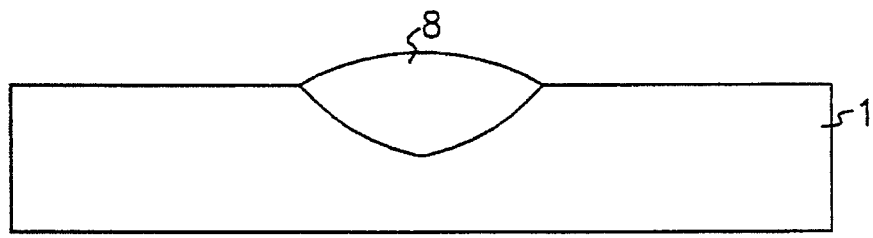

Finally, as shown in FIG. 1E, the process of field oxidation is executed to a thickness of about 3000 to 600 Å at 950° to 1200° C., and the field oxide layer 8 is formed by removing the materials, which are the resistant layers of oxidation.

Furthermore, a polysilicon layer may be stacked with the oxide layer as the pad materials, which are used in the above embodiment of the present invention, the field oxide layer can be formed after forming a trench by etching the substrate at the time of the spacer etching process in FIG. 1D.

As described above, the present invention has an effect in that the bird's beak formed at the edge of the field oxide layer is decreased and an improved profile of the field oxide layer is accomplished.

What is claimed is:

1. A method for forming a field oxide layer in a semiconductor device comprising the steps of:

forming a pad layer and a first resistant layer of oxidation, in turn, on a substrate;

opening a field region by etching a portion of said resistant layer of oxidation, whereby a part of said pad layer remains;

forming said pad layer into a oxynitride layer;

forming a second and a third resistant layer of oxidation, in turn, on a resultant structure;

forming a spacer layer by applying anisotropic etching to said third resistant layer of oxidation;

exposing a portion of said substrate by etching said second resistant layer of oxidation and said oxynitride layer; and forming said field oxide layer by oxidizing said substrate.

2. A method according to claim 1, wherein said pad layer is a oxide layer.

3. A method according to claim 1, wherein said pad layer is, in turn, a stacked layer of an oxide layer and a polysilicon layer on said substrate.

4. A method according to claim 1, wherein the step of exposing a portion of said substrate further comprising the step of forming a trench which is formed by etching said substrate.

5. A method according to claim 1, wherein the step of exposing a portion of said substrate further comprising the step of removing said spacer layer.

6. A method according to claim 1, wherein said first resistant layer of oxidation is, in turn, a stacked layer of a nitride layer and a oxide layer on said pad layer.

7. A method according to claim 1, wherein said second resistant layer of oxidation is a nitride layer.

8. A method according to claim 4, wherein the step of forming a trench further comprising the step of removing said spacer layer.

* * * * *

UNITED STATES PATENT AND TRADEMARK OFFICE
CERTIFICATE OF CORRECTION

PATENT NO. : 5,510,290

DATED : April 23, 1996

INVENTOR(S) : Kwon

It is certified that error appears in the above-identified patent and that said Letters Patent is hereby corrected as shown below:

Tite page, item
[54], Title, line 4 "NITRADATION" should read --NITRATION--
Title page, item
[57], Abstract, line 12 "the" should read --said--

Col. 1, line 4 "NITRADATION" should read --NITRATION--

Col. 1, line 18 "LOGOS" should read --LOCOS--

Col. 1, line 19 "LOGOS" should read --LOCOS--

Col. 1, line 20 "LOGOS" should read --LOCOS--

Col. 2, line 18 "drawing" should read --drawings--

Col. 2, line 29 delete ";" after the word "Referring"

Col. 3, line 3 ", the" should read --. The--

Col. 4, line 3 "is a" should read --consists of an--

Signed and Sealed this

Seventeenth Day of December, 1996

Attest:

BRUCE LEHMAN

*Attesting Officer*   *Commissioner of Patents and Trademarks*